(12) United States Patent
Chandrachood et al.

(10) Patent No.: US 7,790,334 B2
(45) Date of Patent: Sep. 7, 2010

(54) METHOD FOR PHOTOMASK PLASMA ETCHING USING A PROTECTED MASK

(75) Inventors: Madhavi Chandrachood, Sunnyvale, CA (US); Ajay Kumar, Cupertino, CA (US); Wai-Fan Yau, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 991 days.

(21) Appl. No.: 11/044,339

(22) Filed: Jan. 27, 2005

(65) Prior Publication Data

US 2006/0166106 A1 Jul. 27, 2006

(51) Int. Cl.
*G03F 1/00* (2006.01)
(52) U.S. Cl. .............................. 430/5; 430/311; 430/394
(58) Field of Classification Search .................. 430/5, 430/311; 716/19, 21
See application file for complete search history.

(56) References Cited

U.S. PATENT DOCUMENTS

| | | | |
|---|---|---|---|
| 4,263,088 A | 4/1981 | Gorin | |
| 4,357,195 A | 11/1982 | Gorin | |
| 4,579,623 A | 4/1986 | Suzuki et al. | |
| 4,784,720 A | 11/1988 | Douglas | |
| 4,790,903 A | 12/1988 | Sugano et al. | |
| 4,855,017 A | 8/1989 | Douglas | |
| 4,863,549 A | 9/1989 | Grunwald | |
| 4,889,588 A | 12/1989 | Fior | |
| 4,891,118 A | 1/1990 | Ooiwa et al. | |
| 5,087,857 A | 2/1992 | Ahn | |
| 5,160,408 A | 11/1992 | Long | |
| 5,302,241 A | 4/1994 | Cathey, Jr. | |
| 5,352,324 A | 10/1994 | Gotoh et al. | |
| 5,362,358 A | 11/1994 | Yamagata et al. | |
| 5,468,341 A | 11/1995 | Samukawa | |
| 5,474,864 A | 12/1995 | Isao et al. | |
| 5,482,799 A | 1/1996 | Isao et al. | |
| 5,605,776 A | 2/1997 | Isao et al. | |
| 5,614,060 A | 3/1997 | Hanawa | |
| 5,629,114 A | 5/1997 | Isao et al. | |

(Continued)

FOREIGN PATENT DOCUMENTS

DE 36 13 181 10/1987

(Continued)

OTHER PUBLICATIONS

Office Action from Taiwan Patent Application No. 95102080; copy consists of 3 pages.

(Continued)

*Primary Examiner*—Mark F Huff
*Assistant Examiner*—Rashid Alam
(74) *Attorney, Agent, or Firm*—Patterson & Sheridan, LLP (57) ABSTRACT

A method for etching chromium and forming a photomask is provided. In one embodiment, a method for etching chromium includes providing a film stack in a processing chamber having a chromium layer, patterning a photoresist layer on the film stack, depositing a conformal protective layer on the patterned photoresist layer, etching the conformal protective layer to expose a chromium layer through the patterned photoresist layer, and etching the chromium layer. The methods for etching chromium of the present invention are particularly suitable for fabricating photomasks.

13 Claims, 8 Drawing Sheets

U.S. PATENT DOCUMENTS

| | | | |
|---|---|---|---|
| 5,674,647 A | 10/1997 | Isao et al. | |
| 5,683,538 A | 11/1997 | O'Neill et al. | |
| 5,691,090 A | 11/1997 | Isao et al. | |
| 5,705,081 A | 1/1998 | Inazawa et al. | |
| 5,830,607 A | 11/1998 | Isao et al. | |
| 5,938,897 A | 8/1999 | Isao et al. | |
| 5,952,128 A | 9/1999 | Isao et al. | |
| 6,022,460 A | 2/2000 | O et al. | |
| 6,193,855 B1 | 2/2001 | Gopalraja et al. | |
| 6,228,541 B1 | 5/2001 | Isao et al. | |
| 6,268,257 B1* | 7/2001 | Wieczorek et al. | 438/305 |
| 6,284,148 B1 | 9/2001 | Laermer et al. | |
| 6,391,791 B1 | 5/2002 | Sasaki et al. | |
| 6,535,274 B2 | 3/2003 | Antoni | |
| 6,569,577 B1 | 5/2003 | Isao et al. | |
| 6,569,595 B1* | 5/2003 | Sato et al. | 430/270.1 |
| 6,689,515 B2 | 2/2004 | Yoshioka et al. | |
| 6,716,758 B1 | 4/2004 | Donohoe et al. | |
| 2003/0089680 A1 | 5/2003 | Johnson et al. | |
| 2003/0165751 A1 | 9/2003 | Elian et al. | |
| 2003/0180631 A1* | 9/2003 | Shiota et al. | 430/5 |
| 2004/0086789 A1* | 5/2004 | Hasegawa et al. | 430/5 |
| 2004/0097077 A1* | 5/2004 | Nallan et al. | 438/689 |
| 2005/0008945 A1 | 1/2005 | Brooks | |
| 2005/0106475 A1* | 5/2005 | Schroeder et al. | 430/5 |
| 2006/0083993 A1* | 4/2006 | Kirch et al. | 430/5 |

FOREIGN PATENT DOCUMENTS

| | | |
|---|---|---|
| DE | 37 06 127 | 10/1987 |
| DE | 39 40 083 A1 | 6/1991 |
| DE | 42 02 447 | 7/1992 |
| DE | 42 04 848 | 8/1992 |
| EP | 0 200 951 A2 | 12/1986 |
| EP | 0 363 982 A2 | 4/1990 |
| EP | 0 383 570 A2 | 8/1990 |
| EP | 0 363 982 | 10/1990 |
| EP | 0 497 023 A1 | 8/1992 |
| EP | 0 710 977 A1 | 5/1996 |
| EP | 0 734 046 A2 | 9/1996 |
| EP | 1 420 438 A2 | 5/2004 |
| JP | 59-47733 | 3/1984 |
| JP | 60-50923 | 3/1985 |
| JP | 60-62125 | 4/1985 |
| JP | 61-1023 | 1/1986 |
| JP | 61-263125 | 11/1986 |
| JP | 63-013334 | 1/1988 |
| JP | 63-115338 | 5/1988 |
| JP | 2-14523 | 1/1990 |
| JP | 2-156529 | 6/1990 |
| JP | 2-312229 | 12/1990 |
| JP | 03-129820 | 6/1991 |
| JP | 6-181185 | 6/1994 |
| JP | 6-342769 | 12/1994 |
| JP | 7-142453 | 6/1995 |
| JP | 08-314115 A | 11/1996 |
| JP | 10079372 | 3/1998 |
| JP | 2001068462 A | 3/2001 |
| JP | 2007505366 A | 3/2007 |
| TW | 200406645 | 5/2004 |
| TW | 200412471 | 7/2004 |
| WO | WO 88/09830 A1 | 12/1988 |
| WO | WO 01/96955 A | 12/2001 |
| WO | WO-2004/034445 A2 | 4/2004 |
| WO | WO-2004/102793 A2 | 11/2004 |

OTHER PUBLICATIONS

Tsujimoto, et al., A New Side Wall Protection Technique in Microwave Plasma Etching Using a Chopping Method, 18th (1986 International) Conference of Solid State Devices and Materials, Tokyo, 1986, pp. 229-232.

Mahi , et al., The Etching of Silicon in Diluted SF6 Plasmas: Correlation between the Flux of Incident Species and the Etching Kinetics, Journal of Vacuum Science and Technology B, May 1987, pp. 657-666, vol. 5, No. 3.

Maruyama et al., Reduction of Charge Build-Up with Pulse-Modulated Bias in Pulsed Electron Cyclotron Resonance Plasma, Jpn. J. Appl. Phys., 1998, 2306-2310, vol. 37.

Kawakami, et al., Time Modulated Etching for High-Aspect Ratio Patterning, 35th Applied Physics Related Joint Lecture, Mar. 28, 1988, pp. 28-G-5.

Okudaira, et al., Micromachining by Plasma, EP-89, 1989, p. 9-18.

Rangelow, I., High Resolution Tri-Level Process by Downstream-Microwave RF-Biased Etching, SPIE, 1990, vol. 1392, Advanced Techniques for Integrated Circuit Processing.

Tin, et al., Effects of RF Bias on Remote Microwave Plasma Assisted Etching of Silicon in SF6, J. Electrochem. Soc., Oct. 1991, vol. 138, No. 10, pp. 3094-3100.

Paul, et al., Fabrication of High Aspect Ratio Structures using Chlorine Gas Chopping Technique, Microelectronic Engineering, 1997, pp. 79-82, vol. 35.

Ogata, et al., A New Microwave Plasma Etching System Using Time Modulation Bias Technology, Hitachi Review, 1999, pp. 344-348, vol. 48, No. 6.

Schaepkens, et al., J. Vac. Sci. Technol. B, Mar./Apr. 2000, pp. 856-863, vol. 18, No. 2.

Abstract from Korean Patent KR 2002002687A, Jan. 10, 2002, Hynix Semiconductor Inc.

Wu et al., MoSi Etch of Phase-Shift Masks, Journal of Microlithography, Microfabrication, and Microsystems, Jan. 2003, pp. 54-60, vol. 2, Issue 1.

Abstract from Korean Patent KR 2003002844A, Jan. 9, 2003, Hynix Semiconductor Inc.

Seo, et al., The Feasibility Study of Thin Cr Film for Low Process Bias, Photomask Japan 2003 Conference 5130, Apr. 16, 2003, Proceedings of SPIE, vol. 5130.

Wu, An Investigation of Cr Etch Kinetics, 23rd Annual BACUS Symposium on Photomask Technology. Edited by Kimmel, Kurt R.; Staud, Wolfgang. Proceedings of the SPIE, Dec. 2003, pp. 701-712, vol. 5256.

Kim et al., Decrease of Chrome Residue on MoSiON in Embedde Attenuated-PSM Processing, Apr. 2004, Photomask Japan 2004 Conference, Proceedings of SPIE, 2004, vol. 5446.

Wu, Photomask Cr-MoSi Etching, Journal of Vacuum Science & Technology B: Microelectronics and Nanometer Structures, May 2004, pp. 1150-1159, vol. 22, Issue 3.

Philipsen, et al., Printability of Topography in Alternating Aperture Phase-Shift Masks, Proceedings of SPIE, Oct. 2004, pp. 587-595, vol. 5567.

European Search Report in EP 06250437 dated May 30, 2008, 7 pages.

Official Letter dated Oct. 27, 2009, from the Japanese Patent Office for corresponding Japanese Patent application No. 2006-016897.

Official Letter dated Oct. 13, 2009, from the European Patent Office for corresponding European Patent application No. 06 250 437.8-2222.

* cited by examiner

METHOD FOR PHOTOMASK PLASMA ETCHING USING A PROTECTED MASK

BACKGROUND OF THE INVENTION

1. Field of the Invention

Embodiments of the present invention generally relate to a method for plasma etching chromium and, more specifically, to a method for etching a chromium layer during photomask fabrication.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask is typically a glass or a quartz substrate that has a layer of chromium on one side. The chromium layer is covered with an anti-reflective coating and a photosensitive resist. During a patterning process, the circuit design is written onto the mask by exposing portions of the resist to ultraviolet light, making the exposed portions soluble in a developing solution. The soluble portion of the resist is then removed to create a pattern. This pattern allows the exposed underlying chromium to be etched. The etch process removes the chromium and anti-reflective layers from the mask at locations where the resist was removed, i.e., the exposed chromium is removed.

Another mask utilized for patterning is known as a quartz phase shift mask. The quartz phase shift mask is similar to the mask described above, except that alternating adjacent areas of quartz regions exposed through the patterned chromium layer are etched to a depth about equal to half the wavelength of light which will be utilized to transfer the circuit patterns to a substrate during fabrication. The chromium layer is removed after quartz etching. Thus, as the light is shown through the quartz phase shift mask to expose resist disposed on the substrate, the light impinging the resist through one opening in the mask is 180 degrees out of phase relative to the light passing through the immediately adjacent opening. Therefore, light that may be scattered at the edges of the mask opening is cancelled out by the 180 degree out of phase, light scattering at the edge of the adjacent opening, causing a tighter distribution of light in a predefined region of the resist. The tighter distribution of light facilitates writing of features having smaller critical dimensions. Similarly, masks used for chromeless etch lithography also utilize the phase shift of light passing through quartz portions of two masks to sequentially image the resist, thereby improving the light distribution utilized to develop the resist pattern. The phase shift of light through the mask may also be realized using a patterned layer of silicon nitride (SiN) doped with molybdenum (Mb) that caused the imaging light passing through the patterned portions of mask to be 180 degrees out of phase to the light passing through the quartz substrate exposed through openings in the patterned layer.

In one etch process, known as dry etching, reactive ion etching, or plasma etching, a plasma is used to enhance a chemical reaction and etch the patterned chromium area of the mask. Undesirably, conventional chromium etch processes often exhibit etch bias due to attack on the photoresist material utilized to pattern the chromium layer. As the resist is attacked during the chromium etch, the critical dimension of patterned resist is not accurately transferred to the chromium layer. Thus, conventional chromium etch processes may not produce acceptable results for masks having critical dimensions less than about 5 µm. This results in non-uniformity of the etched features of the mask and correspondingly diminishes the ability to produce features for devices having small critical dimensions using the mask.

As the critical dimensions of mask continue to shrink, the importance of etch uniformity increases. Thus, a chromium etch process having high etch uniformity is highly desirable.

Thus, there is a need for an improved chromium etch process.

SUMMARY OF THE INVENTION

The present invention generally provides methods for etching chromium. In one embodiment, a method for etching chromium includes providing a film stack having a chromium layer and a patterned photoresist layer in a processing chamber, depositing a conformal protective layer on the patterned photoresist layer, etching the conformal protective layer to expose a chromium layer through the patterned photoresist layer, and etching the chromium layer.

The invention additionally provides methods for forming a photomask. In one embodiment, a method of forming a photomask includes patterning a mask layer on a photomask layer containing at least a chromium layer, depositing a conformal protective layer on the photomask layer, etching the chromium layer through the mask layer having the protective layer disposed thereon to expose an underlying layer, and removing the mask layer and the protective layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Figure 1:
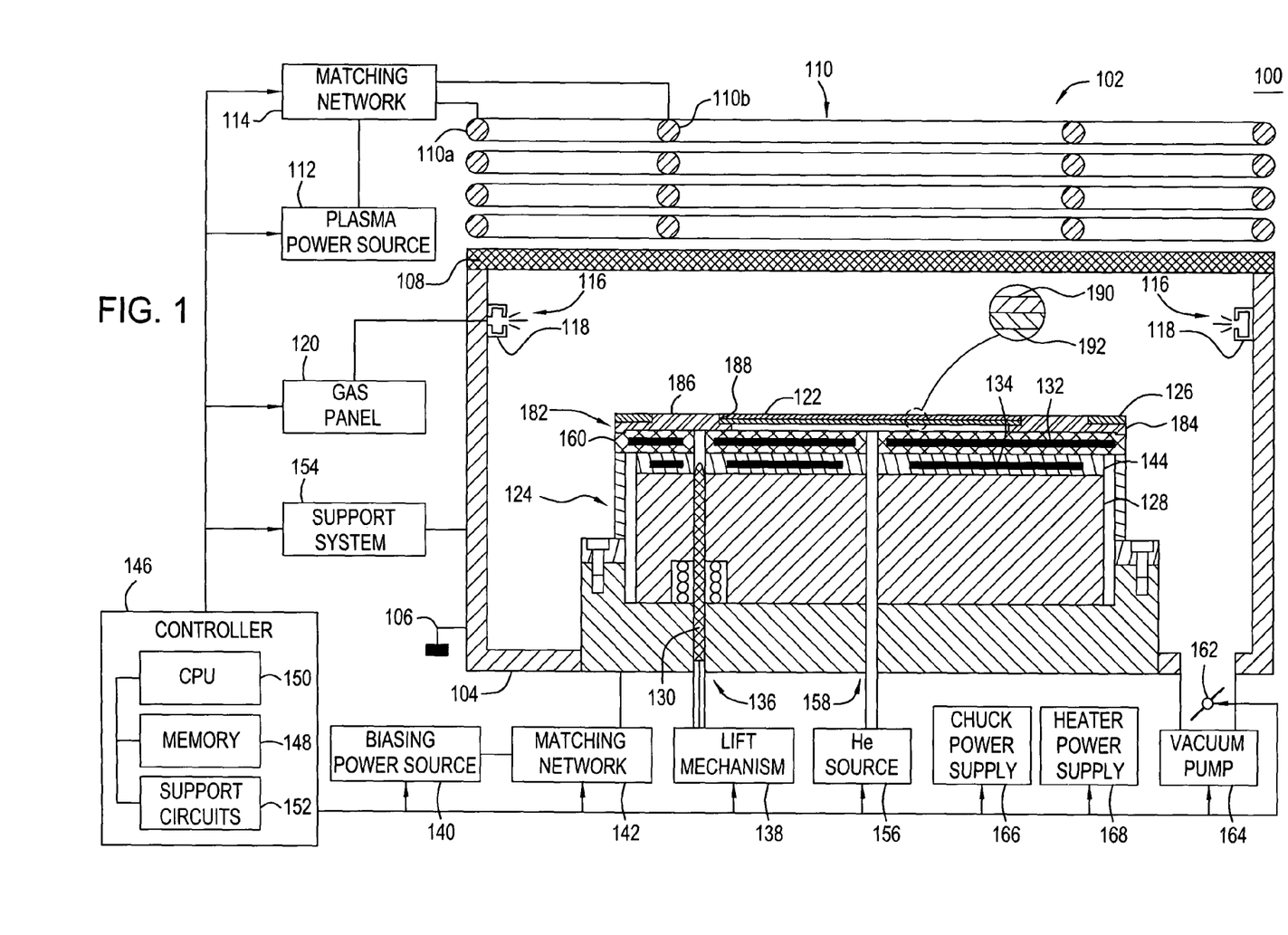
FIG. 1 is a schematic sectional view of one embodiment of an etch reactor suitable for etching a chromium layer.
Figure 6:
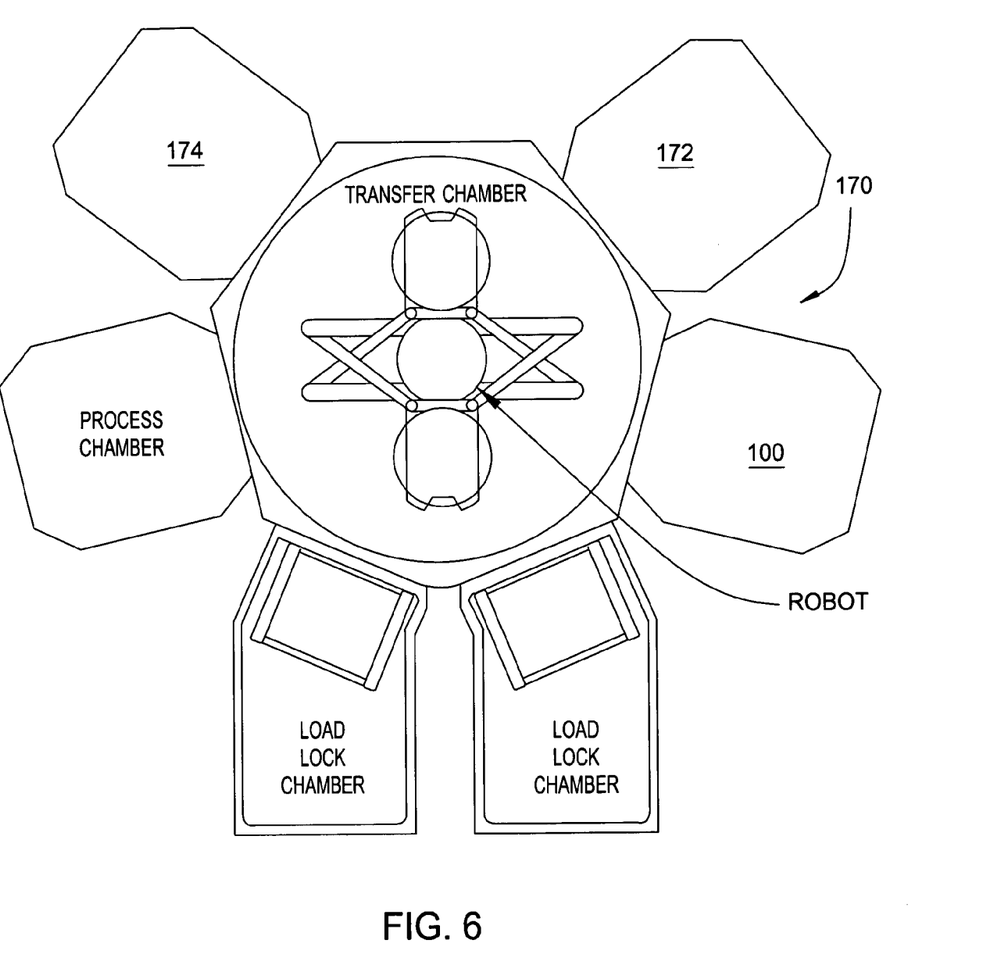
FIG. 6 is a schematic diagram of one embodiment of a processing system, e.g., a cluster tool, including the reactor of FIG. 1.

FIG. 1 depicts a schematic diagram of one embodiment of an etch processing chamber 100 in which a method of quartz etching of the present invention may be practiced. Suitable reactors that may be adapted for use with the teachings disclosed herein include, for example, the Decoupled Plasma Source (DPS®) II reactor, or the Tetra I and Tetra II Photomask etch systems, all of which are available from Applied Materials, Inc. of Santa Clara, Calif. The etch processing chamber 100 may also be used as a processing module of a processing system 170 as shown in FIG. 6, such as, for example, a Centura® integrated semiconductor wafer processing system, also available from Applied Materials, Inc. The processing system may also include a first chamber 172 suitable for ashing and a second chamber suitable for polymer deposition 174. Examples of suitable ashing and deposition chambers include AXIOM HT™ and Tetra II processing chambers, also available from Applied Materials, Inc. The particular embodiment of the processing chamber 100 shown herein is provided for illustrative purposes and should not be used to limit the scope of the invention.

Returning to FIG. 1, the processing chamber 100 generally comprises a process chamber body 102 having a substrate pedestal 124, and a controller 146. The chamber body 102 has a conductive wall 104 that supports a substantially flat dielectric ceiling 108. Other embodiments of the processing chamber 100 may have other types of ceilings, e.g., a dome-shaped ceiling. An antenna 110 is disposed above the ceiling 108. The antenna 110 comprises one or more inductive coil elements that may be selectively controlled (two co-axial elements 110a and 110b are shown in FIG. 1). The antenna 110 is coupled through a first matching network 114 to a plasma power source 112. The plasma power source 112 is typically capable of producing up to about 3000 Watts (W) at a tunable frequency in a range from about 50 kHz to about 13.56 MHz. In one embodiment, the plasma power source 112 provides about 100 to about 600 W of inductively coupled RF power at a frequency of about 13.56 MHz.

The substrate pedestal (cathode) 124 is coupled through a second matching network 142 to a biasing power source 140. The biasing source 140 provides between about zero to about 600 W at a tunable pulse frequency in the range of about 1 to about 10 kHz. The biasing source 140 produces pulsed RF power output. Alternatively, the biasing source 140 may produce pulsed DC power output. It is contemplated that the source 140 may also provide a constant DC and/or RF power output.

In one embodiment, the biasing source 140 is configured to provide RF power less than about 600 Watts at a frequency between about 1 to about 10 kHz, with a duty cycle between about 10 to about 95 percent. In another embodiment, the biasing source 140 is configured to provide RF power between about 20 to about 150 Watts, at a frequency between about 2 to about 5 kHz, with a duty cycle between about 80 to about 95 percent.

In one embodiment configured as a DPS® reactor, the substrate support pedestal 124 includes an electrostatic chuck 160. The electrostatic chuck 160 comprises at least one clamping electrode 132 and is controlled by a chuck power supply 166. In alternative embodiments, the substrate pedestal 124 may comprise substrate retention mechanisms such as a susceptor clamp ring, a vacuum chuck, a mechanical chuck, and the like.

A gas panel 120 is coupled to the processing chamber 100 to provide process and/or other gases to the interior of the process chamber body 102. In the embodiment depicted in FIG. 1, the gas panel 120 is coupled to one or more inlets 116 formed in a channel 118 in the sidewall 104 of the chamber body 102. It is contemplated that the one or more inlets 116 may be provided in other locations, for example, in the ceiling 108 of the processing chamber 100.

In one embodiment, the gas panel 120 is adapted to provide fluorinated process gas through the inlets 116 and into the interior of the process chamber body 102. During processing, a plasma is formed from the process gas and maintained through inductive coupling of power from the plasma power source 112. The plasma may alternatively be formed remotely or ignited by other methods. In one embodiment, the process gas provided from the gas panel 120 includes at least a fluorinated gas and a carbon containing gas. Examples of fluorinated and carbon containing gases include $CHF_3$ and $CF_4$. Other fluorinated gases may include one or more of $C_2F$, $C_4F_6$, $C_3F_8$ and $C_5F_8$.

The pressure in the processing chamber 100 is controlled using a throttle valve 162 and a vacuum pump 164. The vacuum pump 164 and throttle valve 162 are capable of maintaining chamber pressures in the range of about 1 to about 20 mTorr.

The temperature of the wall 104 may be controlled using liquid-containing conduits (not shown) that run through the wall 104. Wall temperature is generally maintained at about 65 degrees Celsius. Typically, the chamber wall 104 is formed from a metal (e.g., aluminum, stainless steel, and the like) and is coupled to an electrical ground 106. The processing chamber 100 also comprises conventional systems for process control, internal diagnostic, end point detection, and the like. Such systems are collectively shown as support systems 154.

A reticle adapter 182 is used to secure a substrate (such as a reticle or other workpiece) 122 onto the substrate support pedestal 124. The reticle adapter 182 generally includes a lower portion 184 milled to cover an upper surface of the pedestal 124 (for example, the electrostatic chuck 160) and a top portion 186 having an opening 188 that is sized and shaped to hold the substrate 122. The opening 188 is generally substantially centered with respect to the pedestal 124. The adapter 182 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 126 may cover and/or secure the adapter 182 to the pedestal 124.

A lift mechanism 138 is used to lower or raise the adapter 182, and hence, the substrate 122, onto or off of the substrate support pedestal 124. Generally, the lift mechanism 138 comprises a plurality of lift pins (one lift pin 130 is shown) that travel through respective guide holes 136.

In operation, the temperature of the substrate 122 is controlled by stabilizing the temperature of the substrate pedestal 124. In one embodiment, the substrate support pedestal 124 comprises a heater 144 and an optional heat sink 128. The heater 144 may be one or more fluid conduits configured to flow a heat transfer fluid therethrough. In another embodiment, the heater 144 may include at least one heating element 134 that is regulated by a heater power supply 168. Optionally, a backside gas (e.g., helium (He)) from a gas source 156 is provided via a gas conduit 158 to channels that are formed in the pedestal surface under the substrate 122. The backside gas is used to facilitate heat transfer between the pedestal 124 and the substrate 122. During processing, the pedestal 124 may be heated by the embedded heater 144 to a steady-state temperature, which in combination with the helium backside gas, facilitates uniform heating of the substrate 122.

The controller 146 comprises a central processing unit (CPU) 150, a memory 148, and support circuits 152 for the CPU 150 and facilitates control of the components of the processing chamber 100 and, as such, of the etch process, as discussed below in further detail. The controller 146 may be one of any form of general-purpose computer processor that can be used in an industrial setting for controlling various chambers and sub-processors. The memory 148 of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 or other computer-readable medium accessible to the CPU 150 as a software routine. Alternatively, such software routine may also be stored and/or executed by a second CPU (not shown) that is remotely located from the hardware being controlled by the CPU 150.

Figure 2:
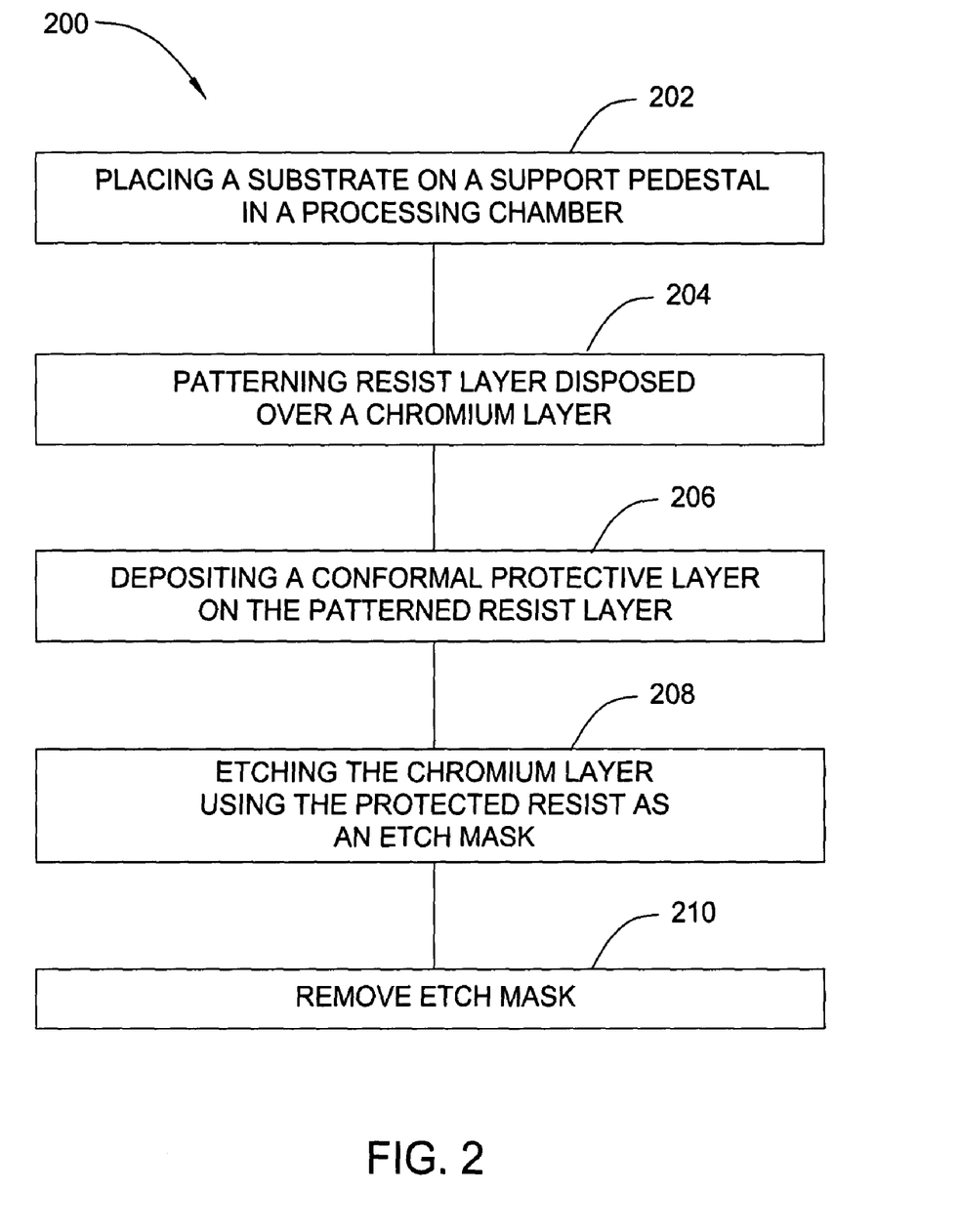
FIG. 2 is a flow diagram of one embodiment of a method for etching a chromium layer.

FIG. 2 is a flow diagram of one embodiment of a method 200 for etching chromium. Although the method 200 is described below with reference to a substrate utilized to fabricate a photomask, the method 200 may also be used to advantage in other chromium etching applications.

The method 200, which may be stored in computer readable form in the memory 148 of the controller 146 or other storage medium, begins at step 202 when the substrate 122 having a film stack disposed therein is placed on a support pedestal 124. In one embodiment, the substrate 122 rests in the opening 188 of the adapter 182. The film stack disposed on the substrate 122 depicted in FIG. 1 includes an optically transparent silicon based material, such as quartz (i.e., silicon dioxide ($SiO_2$)) layer 192, having an opaque light-shielding chromium layer 190, known as a photomask material, forming a patterned mask on the surface of the quartz layer 192. The chromium layer 190 may be chromium and/or chromium oxynitride. The film stack may also include an attenuating layer (not shown), such as silicon nitride (SiN) doped with molybdenum (Mo) or molybdenum silicon (MoSi), interposed between the quartz layer 192 and chromium layer 190.

At step 204, a resist layer is patterned over the chromium layer. The resist layer may be patterned by any suitable method. It is contemplated that the film stack may be disposed in the processing chamber having the resist already patterned thereon.

At step 206, a conformal protective layer is deposited over the patterned resist layer. The protective layer may be a polymer, such as carbon polymer with hydrogen. The protective layer may be deposited to a thickness of between about 100 to about 500 Angstroms, and in another embodiment, is between about 150 to about 200 Angstroms.

In one embodiment, the protective layer is deposited by using a plasma formed from one or more fluorocarbon processing gases, for example, $CHF_3$ and/or $C_4F_8$, among others. Optionally, the plasma may include Ar, which improves deposition uniformity. In one embodiment, the protective layer may be deposited using a plasma power of between about 200 and about 500 W, a bias power between about 0 to about 20 W. In another embodiment, the bias power is less than about 10 W. One exemplary process gas utilized to form the protective layer in a plasma process uses about 100 sccm $CHF_3$ and about 100 sccm Ar, and is maintained at a chamber pressure of about 3 to about 20 milliTorr to form the protective layer up to about 500 Angstroms thick.

At step 208, the chromium layer is etched using the protective layer and resist as an etch mask. The chromium etching step 208 includes first removing the horizontal portions of the protective layer disposed in the openings of the patterned resist to exposed portions of the chromium layer. As the vertical portions of the protective layer disposed on the sidewalls of the patterned resist are removed very slowly as compared to the horizontal portions of the protective layer, chromium layer is etch while the protective layer disposed on the sidewalls of the patterned resist substantially retains its critical dimension (CD) of the opening, thereby allowing accurate transfer of the mask CD to the opening formed in the chromium layer during the etch step 208.

In one embodiment, the etch step 208 forming a plasma from one or more fluorinated process gases are introduced into the processing chamber 100 through the gas inlet 116. Exemplary process gases may include $CF_4$ and $CHF_3$, among others. The processing gas may further include an inert gas, such as He, Ar, Xe, Ne, and Kr.

In another embodiment, the substrate 122 comprising chromium is etched using the Tetra, Tetra II, or DPS® II etch module by providing $CF_4$ at a rate of 2 to 50 standard cubic centimeters per minute (sccm) and $CFH_3$ at a rate of 10 to 50 sccm. One specific process recipe provides $CF_4$ at a rate of 9 sccm, $CHF_3$ at a rate of 26 sccm. The pressure in the process chamber is controlled to less than about 40 mTorr, and in one embodiment, between about 1 and about 10 mTorr, for example 2 mTorr.

During the chromium etch step 208, a substrate bias power less than about 600 W, and in a first example, less than about 100 W and in a second example, between 30 and about 80 W, is applied to the support pedestal 124 to bias the substrate 122. One specific process recipe applies about 65 W of bias power at a tunable pulse frequency in the range of about 1 to about 10 kHz. Optionally, the bias power may be pulsed as described above.

During step 208, plasma, formed from the process gases, is maintained by applying RF power of between about 300 to about 600 W from the plasma power source 112 to the antenna 110. It is contemplated that the plasma may be ignited by any number of methods. In one embodiment, RF power of about 420 W is applied to the antenna 110 at a frequency of about 13.56 MHz.

The chromium layer 190 exposed on the substrate 122 is etched until an endpoint is reached. The endpoint may be determined by time, optical interferometry, chamber gas emission spectrography or by other suitable methods. The etching step may be performed in-situ the processing system 170 or processing chamber 100 in which the deposition step 206 was performed.

Another exemplary etch process is described in U.S. patent application Ser. No. 10/235,223, filed Sep. 4, 2002, which is incorporated herein by reference in its entirety. It is contemplated that other suitable metal etch processes may be utilized.

At step 210, the resist and protective layer remaining after the etch step 208 is removed. In one embodiment, the remaining resist and protective layer is removed by ashing. Removal step 210 may be performed in-situ the processing system 170 or processing chamber 100 in which the etching step 208 was performed.

Advantages of the chromium etch method 200 over conventional etch methods includes reduced etch bias, thus making the method 200 highly desirable in etch applications producing small critical dimensions. Moreover, as the chromium etch method 200 allows more accurately transfers critical dimensions from the resist to openings formed in the chromium layer, layers subsequently etched using the patterned chromium layer exhibit good transfer of critical dimensions, thereby making the method 200 highly desirable for fabrication of masks having small line width, such as 45 nm node applications.

FIGS. 3A-G depict one embodiment of a film stack $300_i$ fabricated into a quartz photomask 340 utilizing the method 200 described above. The subscript "i" is a integer representing different fabrication stages the film stack shown in FIGS. 3A-G.

Figure 3A:
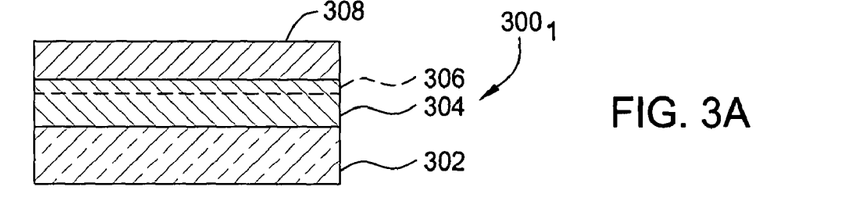
FIGS. 3A-I are one embodiment of quartz photomask fabricated utilizing one embodiment of the chromium layer etch method of the present invention.

The film stack $300_1$ depicted in FIG. 3A includes a quartz layer 302 having a chromium layer 304 disposed thereon. The chromium layer 304 is typically chromium and/or chromium oxide such as those described above. The film stack $300_1$ may include an optional antireflection layer 306 (shown in phantom) formed on the chromium layer 304. The antireflection layer 306 may be a thin layer chromium oxide or other suitable material. The film stack $300_1$ also includes a first resist layer 308 disposed on the chromium layer 304 or antireflection layer 306, when present.

Figure 3B:
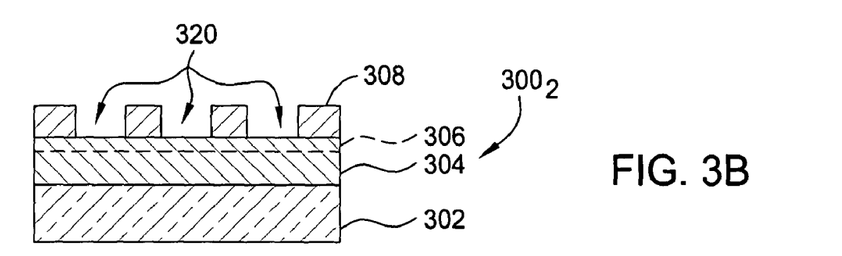
Figure 3C:
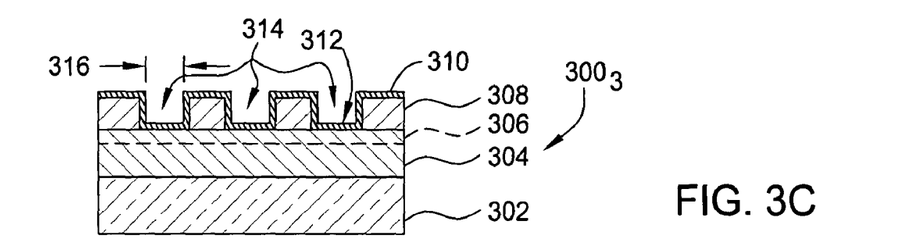
Figure 3D:
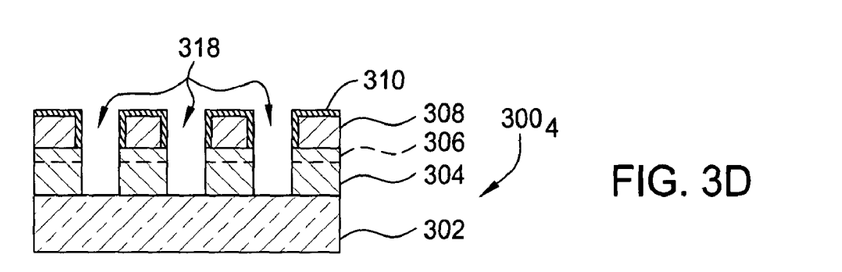

The first resist layer 308 is patterned and utilized as an etch mask to etch the chromium layer 304 to form features 320 exposing the underlying quartz layer 302 as depicted in the film stack $300_2$ illustrated in FIG. 3B.

A conformal protective layer 310 is deposited over the resist 308. The protective layer 310 covers the sidewalls of the features 320 formed in the resist 308 with a predefined thickness to define a trench 314 having a width 316 as shown in the film stack $300_3$ illustrated in FIG. 3C. The width 316 is selected to have a predefined critical dimension to be transferred to the chromium layer 304.

The chromium layer 304 may be etched using a plasma formed from chlorine-containing gas (such as $Cl_2$) or fluorine-containing gases (such as $SF_6$ or $CF_4$). The etch process is substantially anisotropic, thereby breaking through the protective layer at the bottom of the trench 314 to expose and subsequently etch the chromium layer without significantly changing the width 316. As such, the critical dimension 316 is transferred to an opening 318 formed in the chromium layer 304 as shown in the film stack $300_4$ illustrated in FIG. 3D.

Figure 3E:
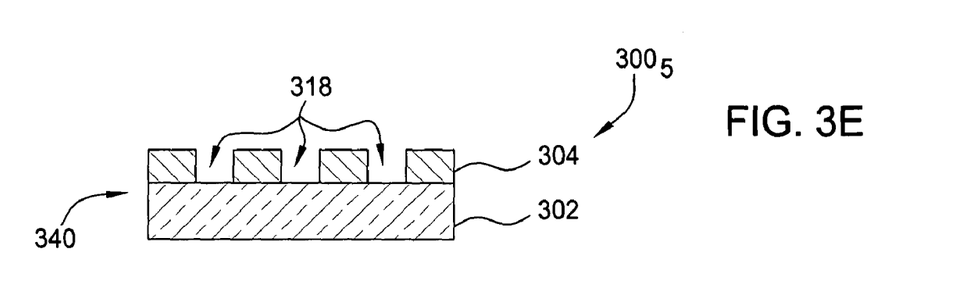
Figure 3F:
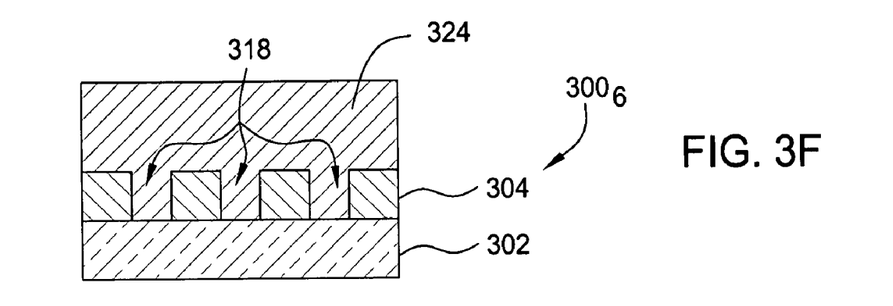

After the openings 318 are formed in the chromium layer 304, the remaining first resist layer 308 is removed, for example, by ashing, to leave the film stack $300_5$ as shown in FIG. 3E. The removal process for the resist layer 308 additionally removes the remaining protective layer 310, leaving a binary photomask 340.

Optionally, the film stack $300_5$ may be further processed to form a phase shift mask as shown in FIGS. 3F-I. To form the phase shift mask, a second resist layer 324 is first disposed on the film stack $300_5$, filling the openings 318 as shown in the film stack $300_6$ illustrated in FIG. 3F. The second resist layer 324 is then patterned. Typically when forming a quartz phase shift mask, the patterned second resist layer 324 exposes the quartz layer 302 at the bottom of alternating openings 318, as shown in the film stack $300_7$ illustrated in FIG. 3G.

Figure 3G:
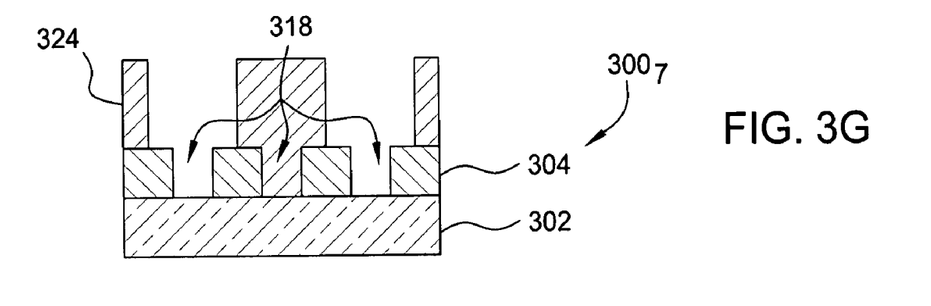

The quartz layer 302 exposed through the patterned second resist layer 312 is etched using a plasma formed from one or more fluorinated process gases. Exemplary process gases may include $CF_4$ and $CHF_3$, among others. The processing gas may further include an inert gas, such as He, Ar, Xe, Ne, and Kr. During etching of the quartz layer 302, the bias power applied to the substrate support may be pulsed as described above.

Figure 3H:
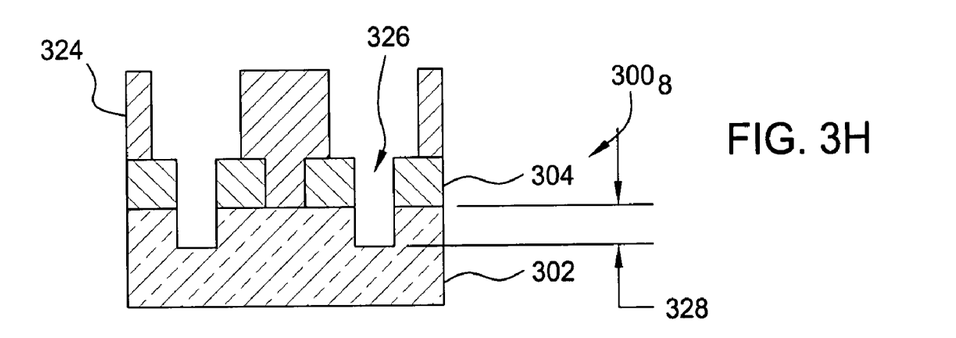
Figure 3I:
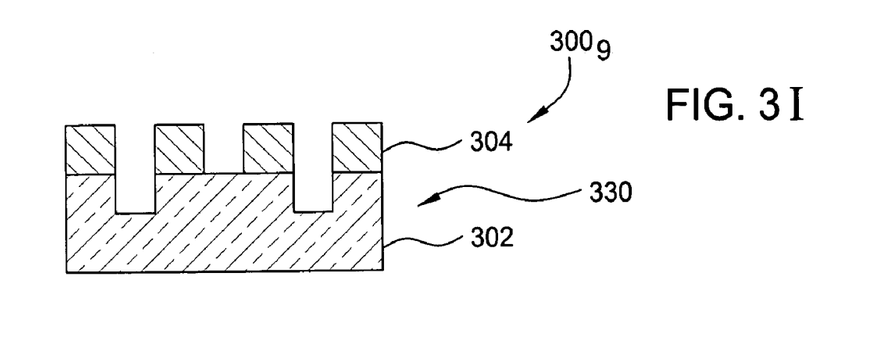

The endpoint of the quartz etch is selected such that a depth 328 of an etched quartz trench 326 shown in the film stack $300_8$ illustrated in FIG. 3H is about equal to the length of 180 degrees phase shift through the quartz layer 302 for a predefined wavelength of light intended for use with the quartz phase shift mask. Typical wavelengths are 193 and 248 nm. Thus, the depth 328 is typically about either 172 or 240 nm, although other depths may be utilized for masks intended for use with different lithographic light wavelengths. After the quartz trench 326 is etched, the remaining second resist layer 324 is removed, for example, by ashing, such that the remaining film stack $300_9$ forms a quartz phase shift mask 330 as shown in FIG. 3I.

FIGS. 4A-G depict one embodiment of a film stack $400_i$ fabricated into a quartz phase shift mask 418 utilizing the method 200 described above. The subscript "i" is a integer representing different fabrication stages the film stack shown in FIGS. 4A-G.

Figure 4A:
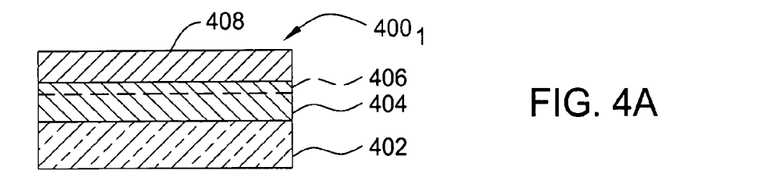
FIGS. 4A-G are one embodiment of quartz phase shift mask fabricated utilizing one embodiment of the chromium layer etch method of the present invention.
Figure 4B:
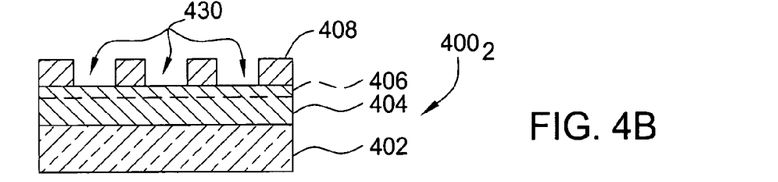

The film stack $400_1$ depicted in FIG. 4A includes a quartz layer 402 having a chromium layer 404 disposed thereon. The chromium layer 404 is typically chromium and/or chromium oxide such as those described above. The film stack $400_1$ may include an optional antireflection layer 406 (shown in phantom) disposed on the chromium layer 404. The film stack $400_1$ also includes a first resist layer 408 disposed on the chromium layer 404 or antireflection layer 406, when present. The first resist layer 408 is patterned to form openings 430 exposing the chromium layer 404, as shown in the film stack $400_2$ illustrated in FIG. 3B.

Figure 4C:
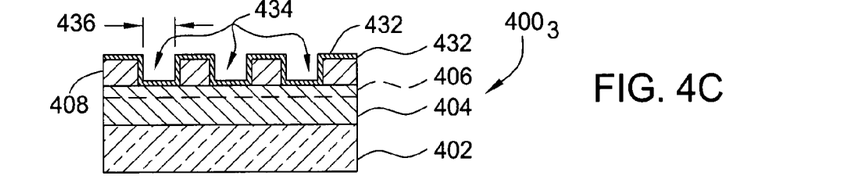

A conformal protective layer 432 is deposited in the chromium layer 404 and first resist layer 408, covering the sidewalls and bottom of the opening 430 as shown in the film stack $400_3$ illustrated in FIG. 4C. The protective layer 432 may be deposited as described with reference to the protective layer 310 above. The thickness of the protective layer 432 is selected such that the feature 434 defined between the vertical portions of the protective layer 432 has a predetermined width 436.

Figure 4D:
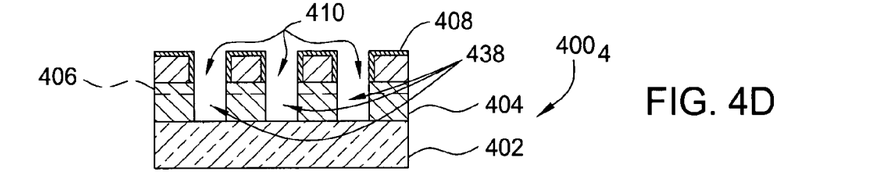
Figure 4E:
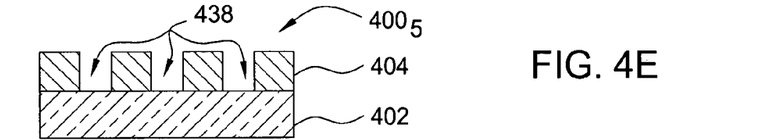

The protective layer 432 and first resist layer 408 are used as a mask to etch an opening 410 in the chromium layer 404, exposing the underlying quartz layer 402 as depicted in the film stack $400_4$ illustrated in FIG. 4D. The etch process is substantially anisotropic, thereby breaking through the protective layer 432 at the bottom of the feature 434 to expose and subsequently etch the chromium layer 404 without significantly changing the width 436. As such, the critical dimension of defined by the feature 410 is transferred to an opening 438 formed in the chromium layer 304. The chromium layer 404 may be etched as described above. The protective layer 432 and first resist layer 408 may be removed, for example, by ashing or other suitable process, as shown in the film stack $400_5$ illustrated in FIG. 4E.

Figure 4F:
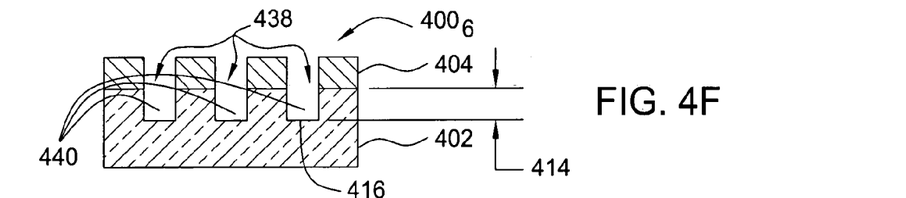

The chromium layer 404 is then utilized as an etch mask for etching the quartz layer 402 as shown in the film stack $400_6$ illustrated in FIG. 4F. The quartz layer 402 may be etched as described above to form a trench 440 having bottom 416. The etching of the quartz layer 404 through the openings 438 substantially transferred the width 436 to the trench 440.

The endpoint of the quartz etch is selected such that a depth 414 of the bottom 416 of the etched quartz trench 440 is about equal to the length of 180 degrees phase shift through the quartz layer 402 for a predefined wavelength of light intended for use with the quartz phase shift mask as described above.

Figure 4G:
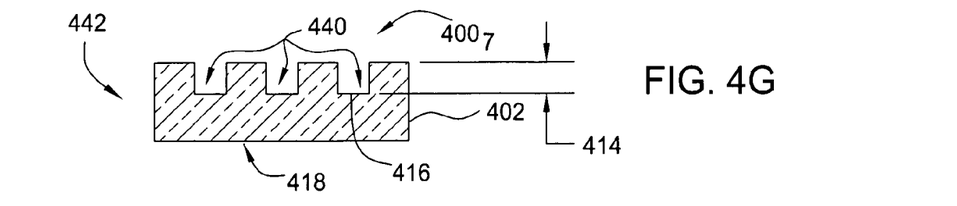

After the trenches 440 are formed in the quartz layer 402, the remaining chromium layer 404 is removed by a suitable process, for example, by a chromium etch as described above, to leave the film stack $400_7$ as a quartz phase shift mask 442, shown in FIG. 4G.

FIGS. 5A-F depict one embodiment of a film stack $500_i$ fabricated into a chromeless etch lithography mask 540 utilizing the method 200 described above. The subscript "i" is an integer representing different fabrication stages of the film stack shown in FIGS. 5A-F.

Figure 5A:
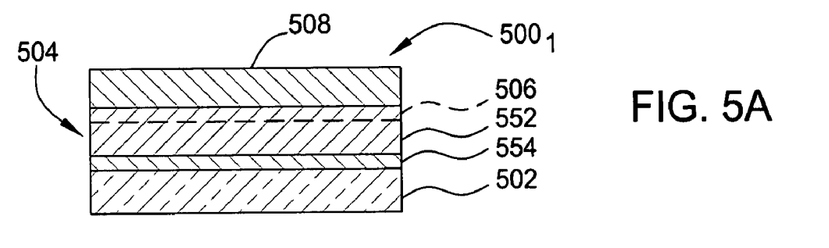
FIGS. 5A-F are one embodiment of quartz phase shift mask fabricated utilizing one embodiment of the chromium layer etch method of the present invention.

The film stack $500_1$ depicted in FIG. 5A includes a quartz layer 502 having a photomask layer 504 disposed thereon. The photomask layer 504 includes a chromium layer 552, for example, chromium and/or chromium oxide as those described above, over an attenuating layer 554. The attenuating layer 554 generally has a thickness about equal to the length of 180 degrees phase shift through the quartz layer 502 for a predefined wavelength of light intended for use with the quartz phase shift mask. Typical wavelengths are 193 and 248 nm. Thus, the thickness of the attenuating layer is typically about 50 to about 100 nm thick, although other depths may be utilized for masks intended for use with different lithographic light wavelengths and/or different attenuating materials.

An optional antireflection layer 506 (shown in phantom) may be formed on the photomask layer 504. A first resist layer 508 is disposed on the photomask layer 504 or antireflection layer 506, when present.

Figure 5B:
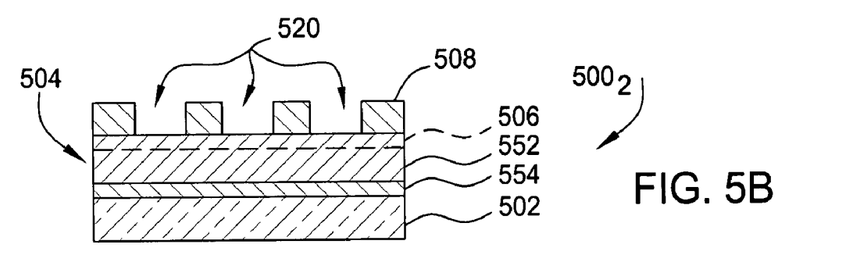

The first resist layer 508 is patterned and utilized as an etch mask to etch the photomask layer 504 to form features 520 exposing the underlying quartz layer 502 as depicted in the film stack $500_2$ illustrated in FIG. 5B.

A conformal protective layer 510 is deposited over the resist 508. The protective layer 510 covers the sidewalls of the features 520 formed in the resist 508 with a predefined thickness to define a trench 514 having a width 516 as shown in the film stack $500_3$ illustrated in FIG. 5C. The width 516 is selected to have a predefined critical dimension to be transferred to the photomask layer 504 (e.g., the attenuating layer 554 and the chromium layer 552).

Figure 5C:
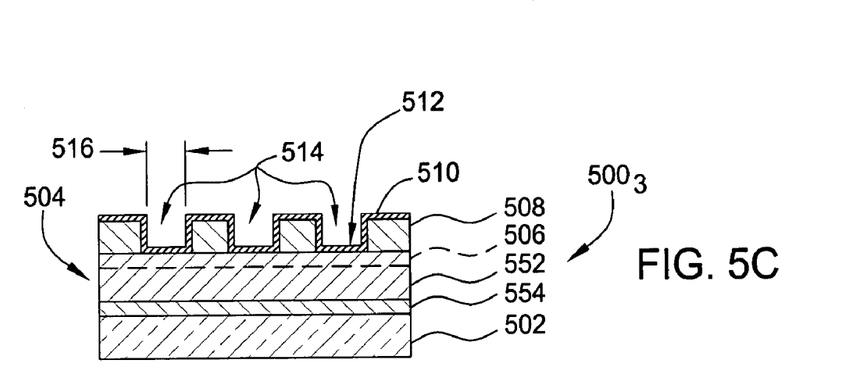

The photomask layer 504 may be etched in a two step process to first etch the chromium layer 552 followed by an etch of the attenuating layer 554. The chromium layer 552 may be etched using a plasma formed from chlorine-containing gas (such as $Cl_2$) or fluorine-containing gases (such as $SF_6$ or $CF_4$). The etch process is substantially anisotropic, thereby breaking through the bottom 512 of protective layer at the bottom of the trench 514 to expose and subsequently etch the chromium layer without significantly changing the width 516.

The attenuating layer 554 may be etched using a plasma formed from chlorine-containing gas (such as $Cl_2$) and/or fluorine-containing gases (such as $SF_6$ or $CF_4$). The two step etch process is substantially anisotropic, thereby breaking through the protective layer at the bottom of the trench 514 to expose and subsequently etch the chromium layer without significantly changing the width 516. The patterned chromium layer functions as a mask to etch the attenuating layer 554. As such, the critical dimension, now defining the width 516, is transferred to an opening 518 formed in the photomask layer 504 as shown in the film stack $500_4$ illustrated in FIG. 5D.

Figure 5D:
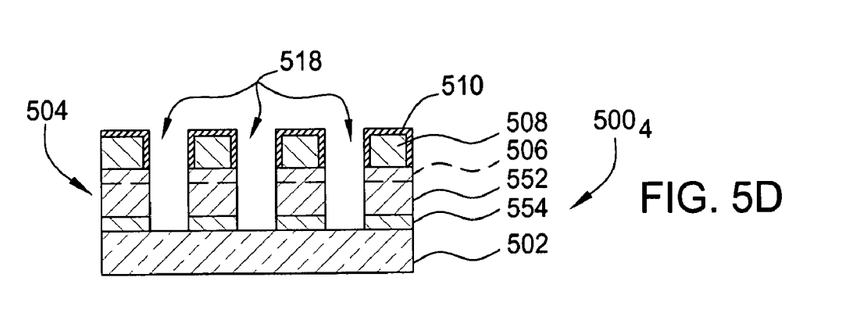

The attenuating layer 554 may be plasma etched by a processing gas including (i) one or more fluorine containing polymerizing materials, (ii) a chlorine containing gas, and optionally, (iii) an inert gas. A polymerization limiting or inhibiting gas may also be included in the processing gas.

The one or more fluorine containing gas may include one or more fluorine containing hydrocarbons, hydrogen free fluorine containing gases, or combinations thereof. The one or more fluorine containing hydrocarbons may have the general formula $C_xH_yF_z$, wherein x is an integer from 1 to 5 of carbon atoms, y is an integer from 1 to 8 of hydrogen atoms, and z is an integer from 1 to 8 of fluorine atoms. Examples of fluorine containing hydrocarbon gases include $CHF_3$, $CH_3F$, $CH_2F_2$, $C_2HF_5$, $C_2H_4F_2$, and combinations thereof. Fluorine containing hydrocarbon gases having from 1 to 2 atoms of carbon, from 1 to 4 atoms of hydrogen, and from 1 to 5 atoms of fluorine, such as $CHF_3$, may be used when etching the attenuating layer 554.

The hydrogen free fluorocarbon gases may have from 1 to 5 atoms of carbon and from 4 to 8 atoms of fluorine. Examples of hydrogen free fluorocarbon gases include $CF_4$, $C_2F_6$, $C_4F_6$, $C_3F_8$, $C_4F_8$, $C_5F_8$, and combinations thereof. Optionally, the processing gas may include additional etching gases for example, sulfur fluorides, such as sulfur hexafluoride ($SF_6$).

Fluorine containing gases may be advantageously used to form passivating polymer deposits on the surfaces, particularly the sidewalls, of openings formed in a patterned resist material and etched optically transparent materials. The passivating polymer deposits prevent excessive etching of the feature definitions, improving the transfer of the planned critical dimensions to the attenuating layer 554. A plasma formed from one or more fluorine containing hydrocarbon gases produces fluorine-containing species that etch the attenuating layer 554 on the substrate 122 without the presence of an oxidizing gas.

The chlorine-containing gases are selected from the group of chlorine ($Cl_2$), carbon tetrachloride ($CCl_4$), hydrochloric acid (HCl), and combinations thereof, and are used to supply highly reactive radicals to etch the optically transparent material. The chlorine-containing gas provides a source of etching radicals and hydrogen or carbon-containing chlorine-containing gases may provide a source of material for forming passivating polymer deposits, which may improve etch bias.

The processing gas may also include an inert gas which, when ionized as part of the plasma comprising the processing gas, results in sputtering species to increase the etching rate of the feature definitions. The presence of an inert gas as part of the plasma may also enhance dissociation of the processing gas. Additionally, inert gases added to the process gas form ionized sputtering species and may further sputter-off any formed polymer deposits on the sidewalls of the freshly etched feature definitions, thereby reducing any passivating deposits and providing a controllable etch rate. It has been observed that the inclusion of an inert gas into the processing gas provides improved plasma stability and improved etching uniformity. Examples of inert gases include argon (Ar), helium (He), neon (Ne), xenon (Xe), krypton (Kr), and combinations thereof, of which argon and helium are generally used.

In one example, the processing gas for etching the attenuating layer 554 may include chlorine ($Cl_2$) gas, trifluoromethane ($CHF_3$), and argon as an inert gas. Optionally, the processing gas may include one or more polymerization limiting gases, such as oxygen, ozone, nitrogen, or combinations thereof, may be used to control the etching rates of the processing gas by controlling the formation and removal of passivating polymer deposits on the substrate. Oxygen containing gases enhance the formation of free oxygen species that react with other species to reduce the formation of polymers that deposit on the surfaces of the etched feature definitions as passivating deposits. For example, oxygen gases react with some of the radicals of the plasma process, such as $CF_2$, to form volatile radicals, such as $COF_2$, which are exhausted from the processing chamber.

The total flow rate of the processing gases, including the inert gas and optional gases, are introduced at a flow rate of greater than about 15 sccm, such as between about 15 sccm and about 200 sccm for etching a 150 mm by 150 mm square photolithographic reticle substrate in an etch chamber. The chlorine-containing gas is introduced into the processing chamber at a flow rate of between about 5 sccm and about 100 sccm for etching a 150 mm by 150 mm square photolithographic reticle substrate. When the fluorine containing gas is introduced into the processing chamber, a flow rate between about 1 sccm and about 50 sccm is used for etching a 150 mm by 150 mm square photolithographic reticle substrate. When the inert gas is introduced into the processing chamber, a flow rate between about 0 sccm and about 100 sccm is used for etching a 150 mm by 150 mm square photolithographic reticle substrate. Optionally, when polymerization limiting gases are introduced into the processing chamber, a flow rate between about 1 sccm and about 100 sccm is used for etching a 150 mm by 150 mm square photolithographic reticle substrate. The individual and total gas flows of the processing gases may vary based upon a number of processing factors, such as the size of the processing chamber, the size of the substrate being processed, and the specific etching profile desired by the operator.

Generally, the processing chamber pressure is maintained between about 2 milliTorr and about 50 milliTorr. A chamber pressure between about 3 milliTorr and about 20 milliTorr, for example, 3 milliTorr and 10 milliTorr, may be maintained during the etching process.

Figure 5E:
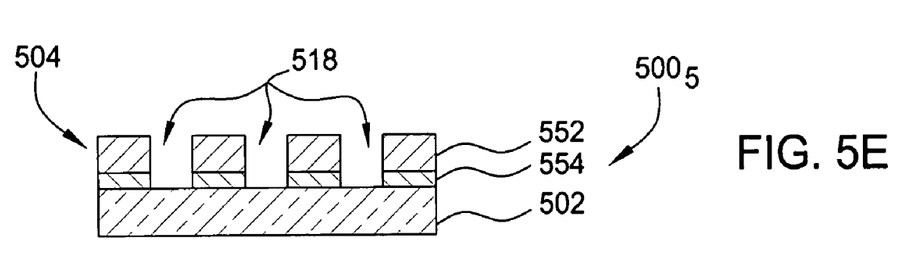
Figure 5F:
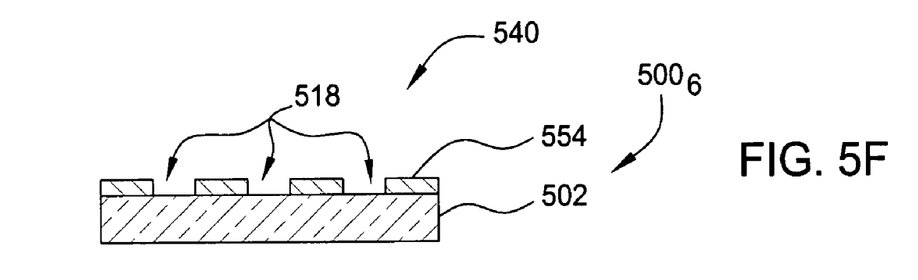

After the openings 518 are formed in the photomask layer 504, the remaining first resist layer 508 is removed, for example, by ashing, to leave the film stack 500₅ as shown in FIG. 5E. The removal process for the resist layer 508 additionally removes the remaining protective layer 510.

The chromium portion of the photomask layer 504 (e.g., the patterned chromium layer 552) is removed by a suitable process, such as a dry etch process as described above. The quartz layer 502 and patterned MoSi layer 554 remaining from the film stack 500₆ forms as a chromeless etch lithography mask 540 shown in FIG. 5F.

Thus, a method for etching a chromium layer has been provided that advantageously improves trench attributes over conventional processes. Accordingly, the method of etching a chromium layer described herein advantageously facilitates fabrication of photomasks suitable for patterning features having small critical dimensions.

While the foregoing is directed to embodiments of the present invention, other and further embodiments of the invention may be devised without departing from the basic scope thereof, and the scope thereof is determined by the claims that follow.

What is claimed is:

1. A method of forming a photomask, comprising:
   patterning a resist mask layer on a photomask layer to define an opening in the resist mask layer, the photomask layer containing at least a chromium layer;
   depositing a conformal polymer protective layer on the patterned resist mask layer with a predefined thickness to define a trench in the patterned resist mask layer, the trench having a sidewall of the conformal polymer protective layer lining the opening in the patterned resist mask layer and a bottom closing the opening in the patterned resist mask layer, wherein the depositing of a conformal polymer protective layer is performed in the presence of one or more fluorocarbon processing gasses;
   anisotropically etching the bottom of the conformal polymer protective layer, while leaving at least a portion of the sidewalls of the conformal polymer protective layer intact to define an opening in the conformal polymer protective layer defined between the sidewalls of the conformal polymer protective layer;
   etching the chromium layer through the opening in the conformal polymer protective layer to expose an underlying layer, wherein the etching of the chromium layer is performed in the presence of a chlorine-containing gas; and
   removing the patterned resist mask layer and the polymer protective layer.

2. The method of claim 1, wherein the step of depositing comprises:
   depositing a polymer to a thickness of between about 100 to about 500 Angstroms.

3. The method of claim 2, wherein the polymer is a carbon polymer with hydrogen.

4. The method of claim 1, wherein the step of depositing further comprises:
   forming a plasma from at least one of $CHF_3$ or $C_4F_8$.

5. The method of claim 4, wherein the step of depositing further comprises:
   introducing Ar into the plasma.

6. The method of claim 1, wherein the step of depositing comprises:
   applying a bias power of between about 0 to about 20 W.

7. The method of claim 1, wherein the step of etching the chromium layer further comprises:
   providing at least one fluorocarbon process gas to a processing chamber; and
   biasing the patterned resist mask layer disposed on a substrate support in the processing chamber with a plurality of power pulses less than 600 W.

8. The method of claim 1, wherein the step of removing the patterned resist mask layer and the polymer protective layer is performed in-situ of the processing chamber in which the step of etching the chromium layer was performed.

9. The method of claim 1, wherein the step of removing the patterned resist mask layer and the polymer protective layer is performed in-situ of a processing system having the processing chamber coupled thereto.

10. The method of claim 1 further comprising:
    etching an attenuating layer using the patterned chromium layer.

11. The method of claim 10, wherein the attenuating layer contains molybdenum.

12. The method of claim 10 further comprising:
    removing the patterned chromium layer.

13. The method of claim 1 further comprising:
    forming a patterned resist layer on the patterned chromium layer, wherein at least a first opening in the chromium layer is filled with resist and at least a second opening in the chromium layer is open through the patterned resist;
    etching the quartz layer through the second opening; and
    removing the patterned resist layer.

* * * * *